United States Patent
Innocent

(10) Patent No.: US 12,002,822 B2
(45) Date of Patent: Jun. 4, 2024

(54) METAL-OXIDE-SEMICONDUCTOR CAPACITOR BASED PASSIVE AMPLIFIER

(71) Applicant: SEMICONDUCTOR COMPONENTS INDUSTRIES, LLC, Phoenix, AZ (US)

(72) Inventor: Manuel H. Innocent, Wezemaal (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 729 days.

(21) Appl. No.: 17/134,809

(22) Filed: Dec. 28, 2020

(65) Prior Publication Data

US 2022/0208814 A1   Jun. 30, 2022

(51) Int. Cl.

| H01L 27/146 | (2006.01) |
| H03M 1/12 | (2006.01) |
| H03M 1/46 | (2006.01) |
| H04N 25/59 | (2023.01) |
| H04N 25/75 | (2023.01) |
| H04N 25/77 | (2023.01) |

(52) U.S. Cl.
CPC .... *H01L 27/14609* (2013.01); *H03M 1/1245* (2013.01); *H03M 1/466* (2013.01); *H04N 25/59* (2023.01); *H04N 25/75* (2023.01); *H04N 25/77* (2023.01)

(58) Field of Classification Search
CPC .. H01L 27/14609; H04N 25/59; H04N 25/75; H04N 25/77; H03M 1/1245; H03M 1/466
See application file for complete search history.

(56) References Cited

U.S. PATENT DOCUMENTS

| 9,071,265 B1 | 6/2015 | Dey | |
| 10,291,254 B2 | 5/2019 | Innocent | |
| 2006/0181622 A1 | 8/2006 | Hong | |
| 2014/0203958 A1 | 7/2014 | Okuda | |
| 2016/0105194 A1 | 4/2016 | Kumbaranthodiyil | |
| 2016/0173804 A1* | 6/2016 | Borremans | H04N 25/59 348/301 |

OTHER PUBLICATIONS

Rabuske et al. "A 9-b 0.4-V Charge-Mode SAR ADC with 1.6-V Input Swing and a MOSCAP-only DAC," European Solid-State Circuits Conference (Sep. 2015).

* cited by examiner

Primary Examiner — Karen Kusumakar
Assistant Examiner — Shawn Shaw Muslim
(74) Attorney, Agent, or Firm — Treyz Law Group, P.C.; Jason Tsai

(57) ABSTRACT

A passive amplifier is provided that includes an input sampling switch, a sampling capacitance, and metal-oxide-semiconductor capacitor devices. An input signal may be sampled onto the sampling capacitance by turning on the input sampling switch while the metal-oxide-semiconductor capacitors are activated. After the sampling phase, the metal-oxide-semiconductor capacitors are deactivated to provide a voltage gain. The voltage gain can be conditionally applied depending on the signal level of the sampled input.

20 Claims, 6 Drawing Sheets

METAL-OXIDE-SEMICONDUCTOR CAPACITOR BASED PASSIVE AMPLIFIER

BACKGROUND

This relates generally to imaging devices and more particularly, to image sensors with amplifiers.

Modern electronic devices such as cellular telephones, cameras, and computers often use digital image sensors. Image sensors (sometimes referred to as imagers) may be formed from a two-dimensional array of image sensing pixels. The array of image sensing pixels are typically arranged in pixel rows and columns. Each pixel includes a photosensitive layer that receives incident photons (light) and converts the photons into electrical charge. Column sensing circuitry is typically coupled to each pixel column for reading out image signals from the image pixels.

The column sensing circuitry often includes active amplifiers. Active column amplifiers typically have a bias current that is greater than their output driving current and are therefore inefficient. Active amplifiers are also noisy, and active suppression of the amplifier noise will increase power consumption. Open loop active amplifiers also tend to be less accurate. It is therefore challenging to design column sensing circuitry with amplifiers.

It is within this context that the embodiments described herein arise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
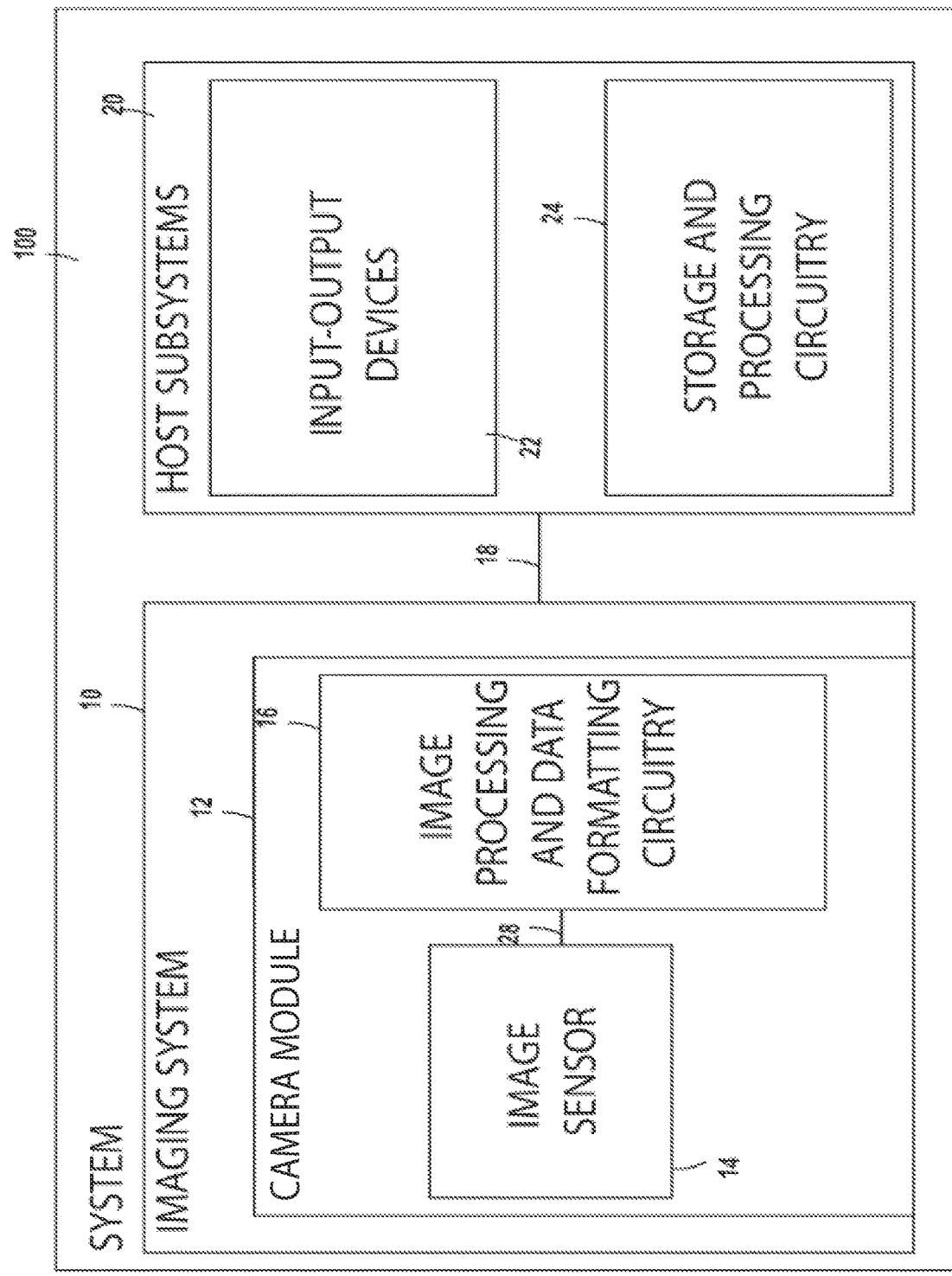
FIG. 1 is a diagram of an illustrative electronic device having an image sensor in accordance with some embodiments.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., image sensor pixels) that convert the light into digital data. Image sensors may have any number of pixels (e.g., hundreds, thousands, millions, or more). A typical image sensor may, for example, have millions of pixels (e.g., megapixels). As examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
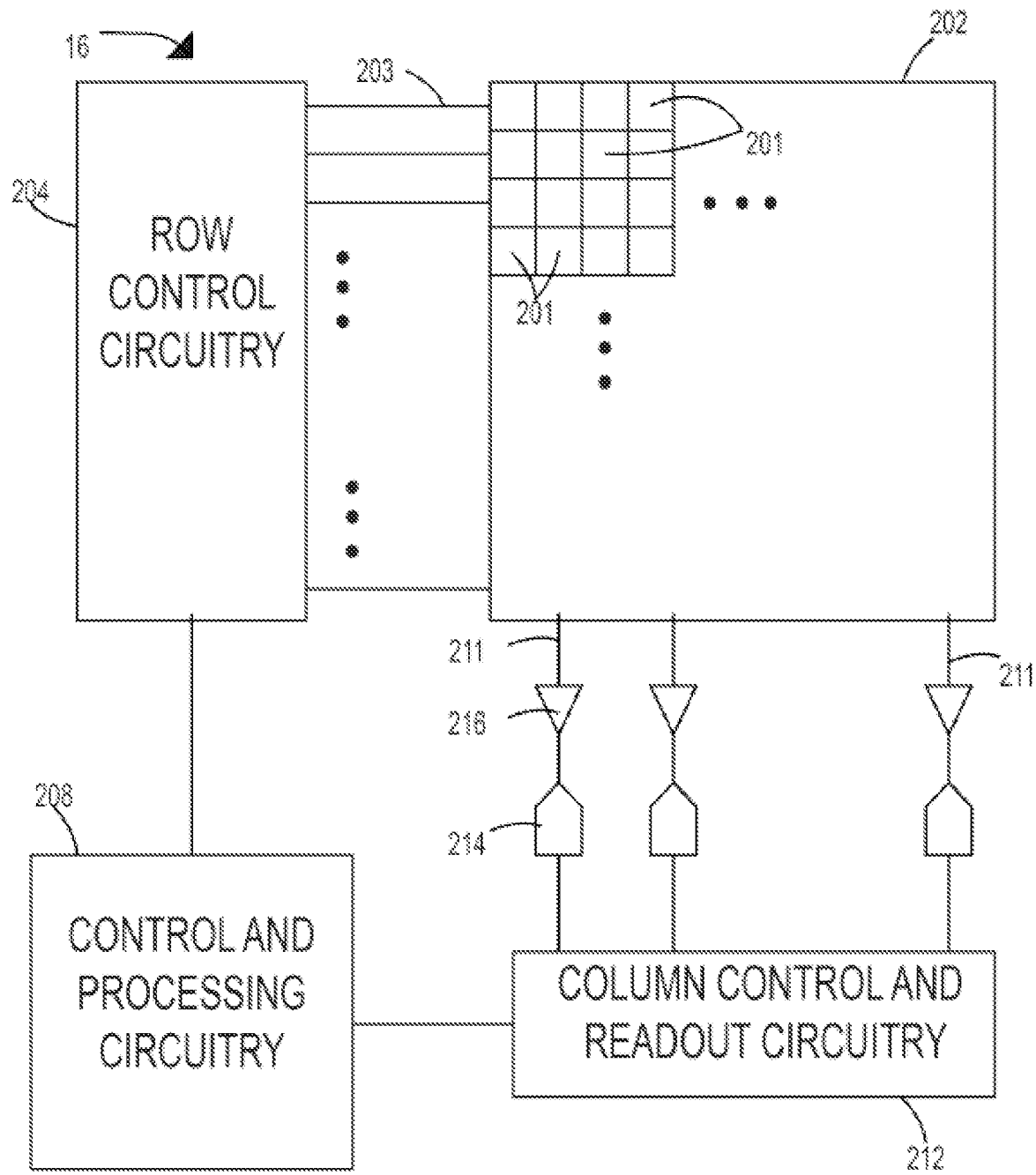
FIG. 2 is a diagram of an illustrative pixel array and associated row and column control circuitry for reading out image signals from an image sensor in accordance with some embodiments.

FIG. 2 is a diagram of an illustrative image pixel array in an image sensor. As shown in FIG. 2, the image sensor (e.g., image sensor 14 of FIG. 1) may include pixel array 202 having multiple pixels 201 (sometimes referred to herein as image pixels 201 or image sensor pixels 201) and row control circuitry 204 that is coupled to image pixel array 202. Row control circuitry 204 may provide pixel control signals (e.g., row select signals, pixel reset signals, charge transfer signals, etc.) to pixels 201 over corresponding row control lines 203 to control the capture and read out of images using image sensor pixels in array 202.

Image sensor 14 may include column control and readout circuitry 212 and control and processing circuitry 208 that is coupled to row control circuitry 204 and column circuitry 212. Column control circuitry 212 may be coupled to array 202 via multiple column lines 211. For example, each column of pixels 201 in array 202 may be coupled to a respective column line 211. A corresponding analog-to-digital converter (ADC) 214 and column amplifier 216 may be interposed on each column line 211 for amplifying analog signals captured by array 202 and converting the captured analog signals to corresponding digital pixel data. Column control and readout circuitry 212 may be coupled to external hardware such as processing circuitry. Column control and readout circuitry 212 may perform column readout based on signals received from control and processing circuitry 208. Column control and readout circuitry 212 may include column ADC circuits 214 and column amplifiers 216.

Amplifier 216 may be configured to receive analog signals (e.g., analog reset or image level signals) from pixel array 202 and to amplify the analog signals. The analog signals may include data from a single column of pixels or from multiple columns of pixels, depending on the application. ADC 214 may receive amplified analog signals from amplifier 216 and may perform analog-to-digital conversion operations on the analog signals to generate digital data. The digital data may be transmitted to column control and readout circuitry 212 for processing and readout.

Array 202 may have any number of rows and columns. In general, the size of array 202 and the number of rows and columns in array 202 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Figure 3:
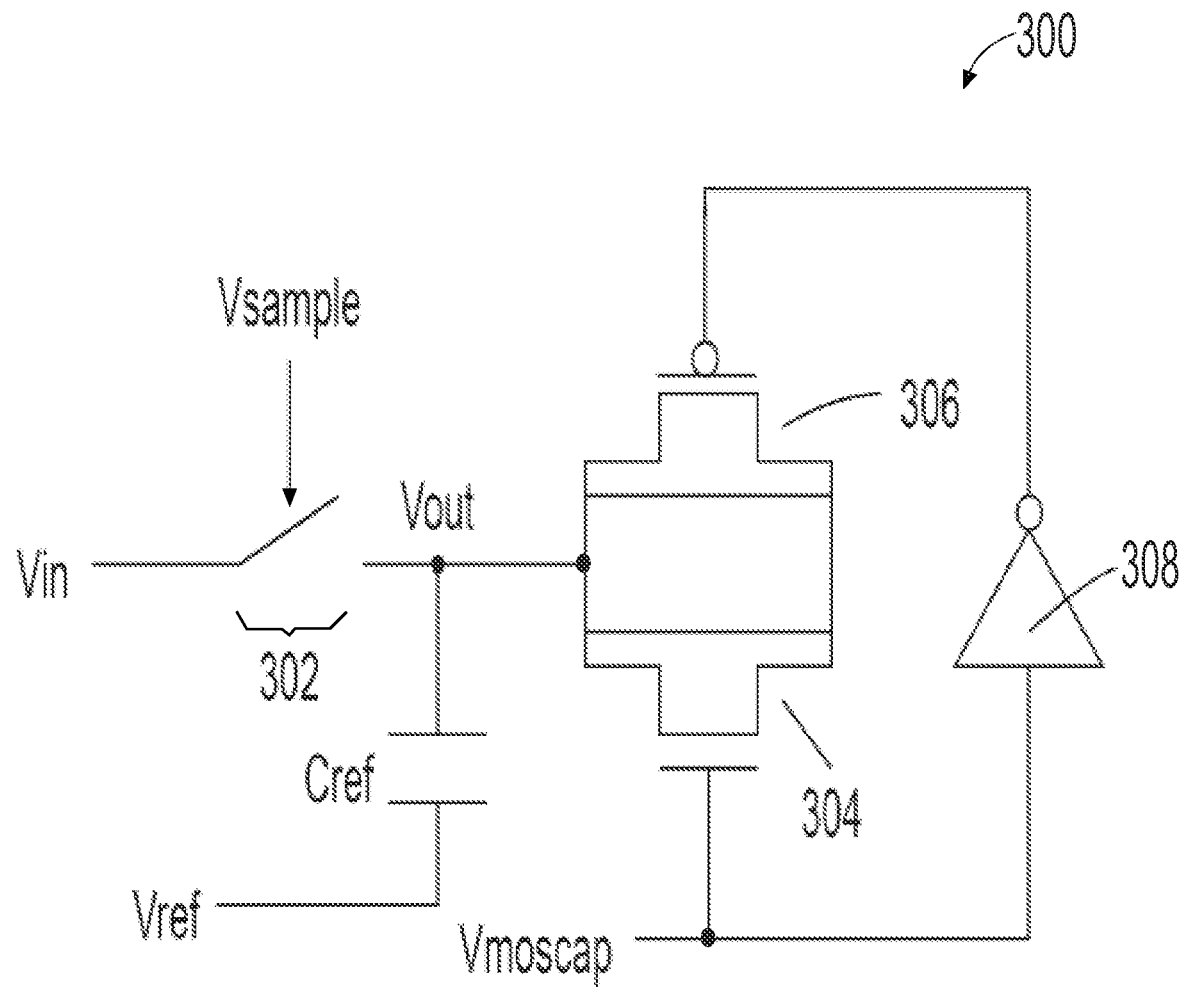
FIG. 3 is a diagram of an illustrative amplifier circuit in accordance with some embodiments.

FIG. 3 is a diagram of an illustrative amplifier circuit such as a passive amplifier circuit 300. Passive amplifier 300 may be used as a column amplifier (see, e.g., amplifier 216 in FIG. 2) within image sensor 14 or as a passive voltage amplifier in other suitable applications. As shown in FIG. 3, amplifier 300 may have an input port configured to receive an input signal Vin and a sampling switch such as switch 302 having a first terminal coupled to the amplifier input port and a having a second terminal coupled to the amplifier output port (i.e., an output port on which amplifier output signal Vout is generated). Sampling switch 302 may be controlled using sampling control signal Vsample. As an example, switch 302 might be an n-channel transistor, and signal Vsample may be asserted (e.g., driven high) to activate switch 302 and deasserted (e.g., driven low) to deactivate switch 302. As another example, switch 302 might be a p-channel transistor, and signal Vsample may be asserted (e.g., driven low) to activate switch 302 and deasserted (e.g., driven high) to deactivate switch 302. As yet another example, switch 302 might be a transmission gate that includes both an n-channel transistor and a p-channel transistor coupled together in parallel.

Amplifier 300 may also include a capacitor such as capacitor Cref having a first terminal coupled to the amplifier output port and having a second terminal configured to receive a reference voltage Vref. As an example, capacitor Cref may be an explicit capacitor, and voltage Vref can be a fixed voltage or a switched (adjustable) voltage for selectively apply a desired amplifier offset amount. As another example, capacitor Cref might only consist of parasitic capacitance (i.e., Cref is not an explicit capacitor). In the scenario where Cref only includes layout parasitics, voltage Vref may be equal to ground (e.g., 0 V, +1 V, −1 V, some negative voltage, etc.) or other suitable voltage level.

Amplifier 300 may further include switchable capacitive structures such as a first metal-oxide-semiconductor capacitor (MOSCAP) 304 and a second metal-oxide-semiconductor capacitor (MOSCAP) 306. The first MOS capacitor 304 may be an n-type (e.g., n-channel) transistor having a gate terminal configured to receive control signal Vmoscap and source-drain terminals coupled to the amplifier output port. The bulk terminal of MOS capacitor 304 may be coupled to a ground power supply line (as an example). The second MOS capacitor 306 may be a p-type (e.g., p-channel) transistor having a gate terminal configured to receive an inverted version of Vmoscap through inverter 308 and source-drain terminals also coupled to the amplifier output port. The bulk terminal of MOS capacitor may be coupled to a positive power supply line (as an example).

The example of FIG. 3 in which amplifier 300 includes both n-type MOSCAP 304 and p-type MOSCAP 306 is merely illustrative. As another example, passive amplifier 300 might include only an n-type MOSCAP 304 without any p-type MOSCAPs 306. As another example, passive amplifier 300 might include only a p-type MOSCAP 306 without any n-type MOSCAPs 304. If desired, passive amplifier 300 may include more than one n-type MOSCAP 304 coupled in parallel to one another. If desired, passive amplifier 300 may include more than one p-type MOSCAP 306 coupled in parallel to one another.

Figure 4:
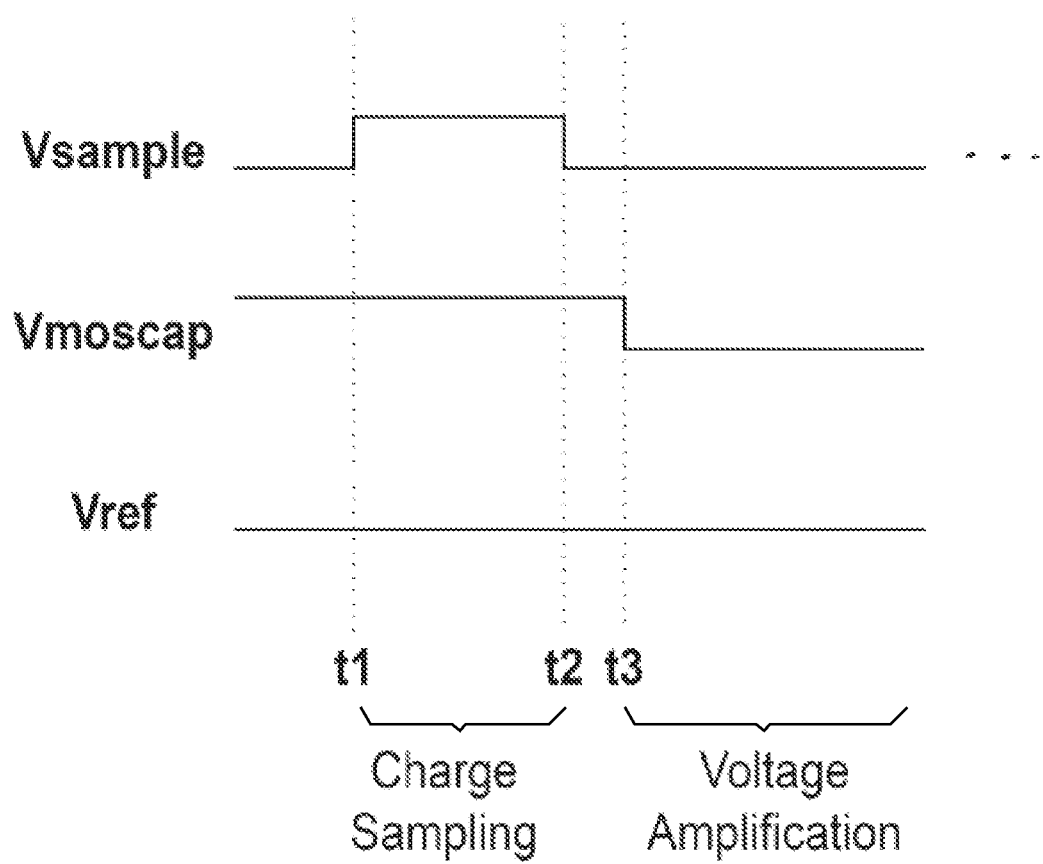
FIGS. 4 and 5 are timing diagrams showing illustrative waveforms involved in operating the amplifier circuit of FIG. 3 in accordance with some embodiments.

FIG. 4 is a timing diagram showing illustrative waveforms involved in operating passive amplifier 300. From time t1 to time t2, control signal Vsample may be pulsed high to perform a charge sampling operation. During the charge sampling phase, the input signal level Vin may be sampled onto capacitor Cref while the MOS capacitors 304 and 306 are activated (turned on). The MOS capacitors are turned on by driving high signal Vmoscap. N-type MOS capacitor 304 may be completely turned on by biasing its gate terminal to at least one threshold voltage above the positive supply voltage level. P-type MOS capacitor 306 may be completely turned on by biasing its gate terminal to at least one threshold voltage below the ground power supply voltage level. During the charge sampling period, the total amount of capacitance at the amplifier output port (i.e., Ctotal) may be equal to the sum of the capacitance of Cref, any device capacitance associated with MOS capacitors 304 and 306, and any parasitic capacitance associated with switch 302.

After the input charge has been sampled onto capacitor Cref, the MOS capacitors are then deactivated (switched off) at time t3 by driving signal Vmoscap low. Turning off the MOS capacitors 304 and 306 will reduce the total amount of capacitance at the amplifier output port by the amount of capacitance associated with MOS capacitors 304 and 306 (i.e., Cmoscap). Since there is nowhere for the sampled charge to discharge and due to the conservation of charge, all of the sampled charge will be pushed onto capacitor Cref, and the voltage on capacitor Cref will be multiplied by a capacitance ratio that is equal to Ctotal/(Ctotal−Cmoscap). The time period following time t3 may therefore sometimes be referred to as a voltage amplification phase.

Figure 5:
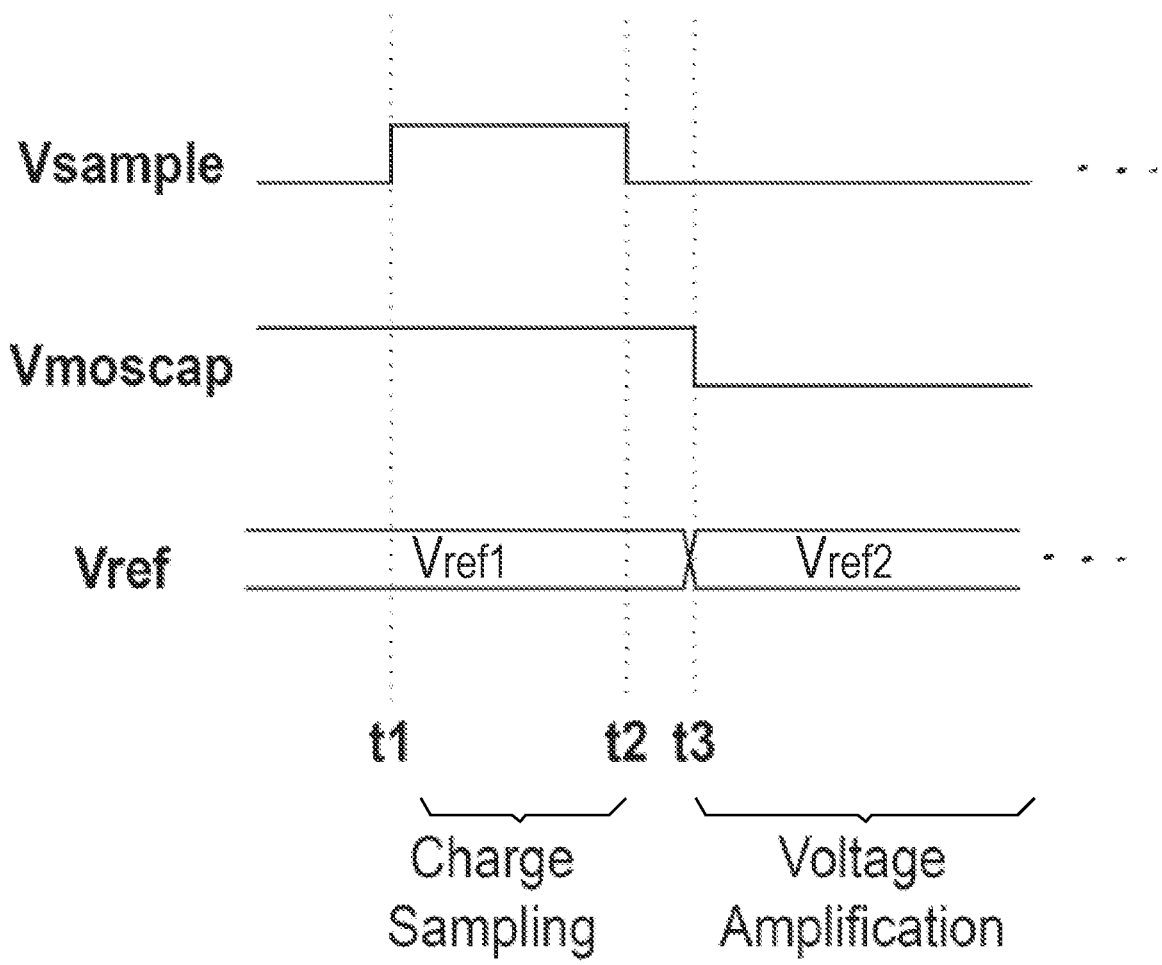

If desired, the amplifier output voltage can be adjusting or shifted by changing signal Vref (see, e.g., the timing diagram of FIG. 5). As shown in FIG. 5, voltage Vref may be switched from a first reference level Vref1 to a second reference level Vref2 at time t3. Vref adjustments might be used when only n-type MOSCAP 304 is present or when only p-type MOSCAP 306 is present. Vref adjustments may or may not be used when MOSCAPs 304 and 306 are both present. Passive amplifier 300 may provide a voltage gain of at least 2×, 3×, 4×, 5×, 6×, 7×, 8×, 9×, 10×, 2-10×, at least 6×, more than 10× over a suitable input voltage range (e.g., over a 100 mV input range, over a 200 mV input range, over a 300 mV input range, etc.).

Configured and operated in this way, passive amplifier 300 may provide a voltage gain on a sample-and-hold stage in a signal path without increasing the noise level beyond the inherent sampling noise and with a reduced power consumption level related only to switching the control signals of the MOS capacitors. Amplifier 300 does not have static power consumption and is therefore truly a "passive" amplifier. The switching of the MOS capacitors 304 and 306 contribute to only dynamic power consumption, which is fairly low. The voltage amplification is also very fast and is not bandwidth limited. The discharging of the MOS capacitors is almost instantaneous and final amplified signal level is immediately reached. Passive amplifier 300 (sometimes referred to as a MOS capacitor based sample-and-hold passive amplifier) is a low power, low noise, and high speed amplifier that is not limited to only image sensor applications.

Figure 6:
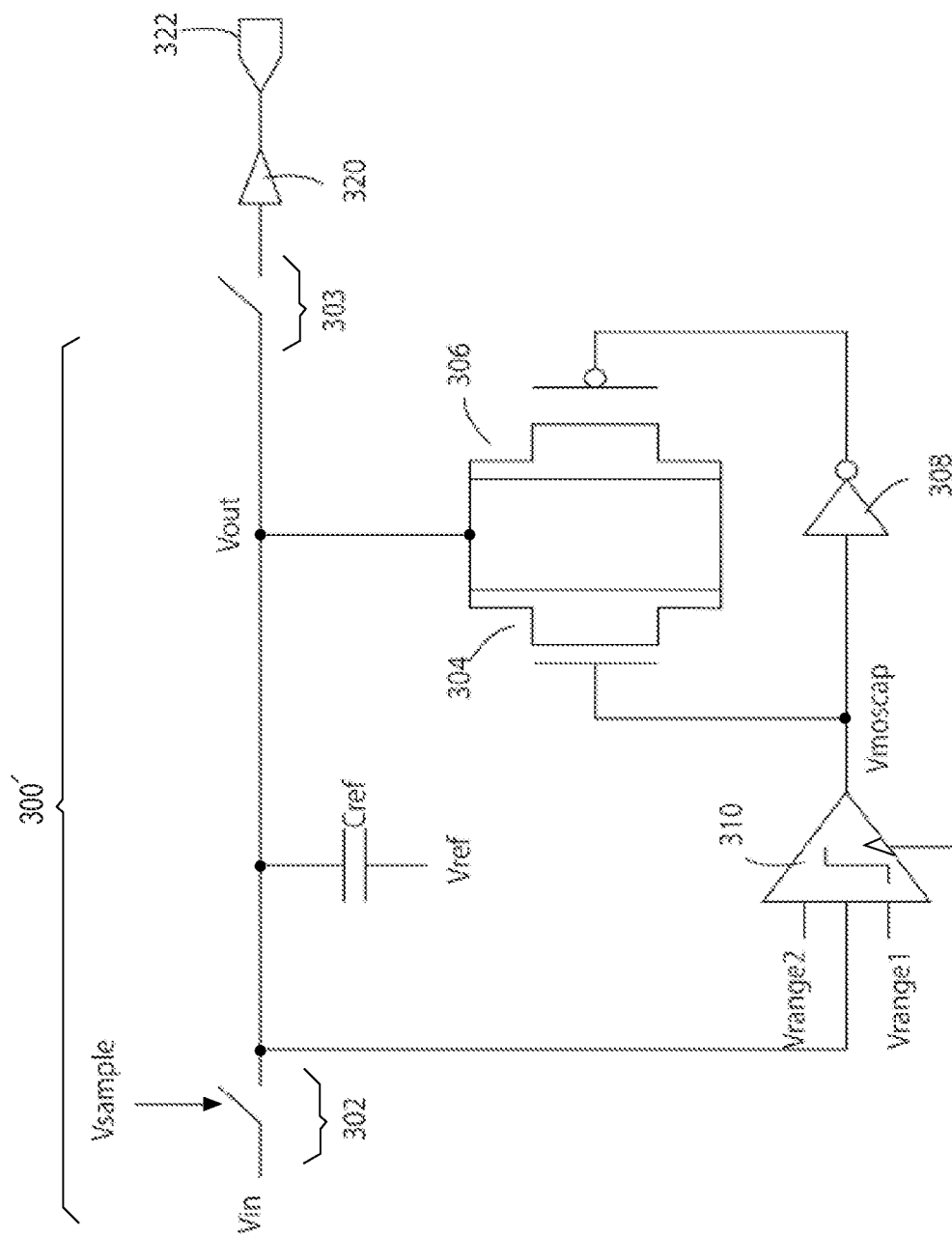
FIG. 6 is a diagram of an illustrative amplifier circuit configured to provide a gain that is conditionally applied based on a column signal level in accordance with some embodiments.

FIG. 6 is a diagram showing how passive amplifier 300' can be configured to conditionally apply voltage gain based on the input signal level. After the input voltage is sampled, the sampled voltage level can be checked and the MOS capacitors can be switched off only when the sampled signal level is sufficiently small (e.g., for only low light signals). As shown in FIG. 6, amplifier 300' may have an input port configured to receive an input signal Vin and a sampling switch such as switch 302 having a first terminal coupled to the amplifier input port and a having a second terminal coupled to the amplifier output port (i.e., an output port on which amplifier output signal Vout is generated). Sampling switch 302 may be controlled using sampling control signal Vsample.

Amplifier 300' may also include a capacitor such as capacitor Cref having a first terminal coupled to the amplifier output port and having a second terminal configured to receive a reference voltage Vref. As an example, capacitor Cref may be an explicit capacitor, and voltage Vref can be a fixed voltage or a switched (adjustable) voltage for selectively apply a desired amplifier offset amount. As another example, capacitor Cref might only consist of parasitic capacitance (i.e., Cref is not an explicit capacitor). In the scenario where Cref only includes layout parasitics, voltage Vref may be equal to ground (e.g., 0 V, +1 V, −1 V, some negative voltage, etc.) or other suitable voltage level.

Amplifier 300' may further include switchable capacitive structures such as a first metal-oxide-semiconductor capacitor (MOSCAP) 304 and a second metal-oxide-semiconductor capacitor (MOSCAP) 306. The first MOS capacitor 304 may be an n-type (e.g., n-channel) transistor having a gate terminal configured to receive control signal Vmoscap and source-drain terminals coupled to the amplifier output port. The bulk terminal of MOS capacitor 304 may be coupled to a ground power supply line (as an example). The second MOS capacitor 306 may be a p-type (e.g., p-channel) transistor having a gate terminal configured to receive an inverted version of Vmoscap through inverter 308 and source-drain terminals also coupled to the amplifier output port. The bulk terminal of MOS capacitor may be coupled to a positive power supply line (as an example).

The example of FIG. 6 in which amplifier 300' includes both n-type MOSCAP 304 and p-type MOSCAP 306 is merely illustrative. As another example, passive amplifier 300' might include only an n-type MOSCAP 304 without any p-type MOSCAPs 306. As another example, passive amplifier 300' might include only a p-type MOSCAP 306 without any n-type MOSCAPs 304. If desired, passive amplifier 300' may include more than one n-type MOSCAP 304 coupled in parallel to one another. If desired, passive amplifier 300' may include more than one p-type MOSCAP 306 coupled in parallel to one another.

MOSCAP control signal Vmoscap may be generated using a comparator such as comparator 310. Comparator 310 may include an input terminal configured to receive the sampled input signal level, additional input terminals configured to receive voltage range levels Vrange1 and Vrange2, and a control input configured to receive comparator control signal Compare. When the input signal Vin is sampled, comparator is 310 is configured such that its output Vmoscap is asserted (e.g., drive high) and the MOS capacitors are activated. At the rising edge of the Compare signal, comparator 310 may determine whether the sampled input signal level at its input terminal is within a predetermined voltage range between Vrange1 and Vrange2. If so, comparator 310 may de-assert (e.g., drive low) signal Vmoscap to deactivate the MOS capacitors. Deactivating the MOS capacitors applies the voltage gain during the voltage amplification phase. If the sampled input signal level is not within the predetermined voltage range, then signal Vmoscap may remain asserted and no voltage amplification will occur.

In the example of FIG. 6, passive amplifier 300' with conditional gain may be used to receive an input signal Vin from an image sensor pixel via a column line. Amplifier output voltage Vout may optionally be coupled to a driver (buffer) 320 via another switch 303. Driver 320 may be a unity-gain buffer (as an example). Buffer 320 may be used to drive a corresponding column analog-to-digital converter (ADC) 322 (see, e.g., ADC 214 in FIG. 2). Passive amplifier 300' (sometimes referred to as a MOS capacitor based sample-and-hold passive amplifier) is a low power, low noise, and high speed amplifier that is not limited to only image sensor applications.

Various embodiments of a passive amplifier are provided. In accordance with some embodiments, an image sensor is provided that includes an image sensor pixel, a column line configured to receive a signal from the image sensor pixel, and a passive amplifier circuit. The passive amplifier circuit can include an input port configured to receive the signal from the column line, an output port, a sampling switch having a first terminal coupled to the input port and having a second terminal coupled to the output port, and a metal-oxide-semiconductor capacitor having a gate terminal configured to receive a control signal and source-drain terminals coupled to the output port. The passive amplifier circuit can further include a capacitor having a first terminal coupled to the output port and having a second terminal configured to receive a reference voltage, and an additional metal-oxide semiconductor capacitor having a gate terminal configured to receive an inverted version of the control signal and having source-drain terminals coupled to the output port. The reference voltage may remain fixed or can change between a charge sampling phase and an amplification phase. The passive amplifier circuit can further include a comparator having an input coupled to the first terminal of the capacitor and an output on which the control signal is generated. The comparator can be configured to deassert the control signal when the signal at the input port is within a predetermined voltage range.

In accordance with some embodiments, a method of operating an image sensor is provided that includes reading a signal from an image sensor pixel, conveying the signal through a column line, receiving the signal from the column line using a passive amplifier; sampling the received signal using the passive amplifier, and activating a metal-oxide-semiconductor capacitor while the received signal is being sampled using the passive amplifier. A voltage gain can be obtained by deactivating the metal-oxide-semiconductor capacitor. The passive amplifier can include a capacitor having a first terminal coupled to the metal-oxide-semiconductor capacitor and a second terminal configured to receive a reference voltage. The method can include biasing the reference voltage to a given voltage level while sampling the received signal and biasing the reference voltage to the given voltage level while obtaining the voltage gain. Alternatively, the method can include biasing the reference voltage to a first voltage level while sampling the received signal and biasing the reference voltage to a second voltage level, different than the first voltage level, while obtaining the voltage gain.

In accordance with some embodiments, an amplifier is provided that includes an input port, an output port, a sampling switch having a first terminal coupled to the input port and having a second terminal coupled to the output port, and a metal-oxide-semiconductor capacitor having source-drain terminals coupled to the output port and having a gate terminal configured to receive a control signal. The amplifier can include an additional metal-oxide-semiconductor capacitor having source-drain terminals coupled to the output port and having a gate terminal configured to receive an inverted version of the control signal. The amplifier can include a capacitor having a first terminal coupled to the output port and having a second terminal configured to receive a reference voltage. If desired, the control signal can be driven high during a charge sampling operation, the control signal can be driven low during an amplification operation, the reference voltage can have a first voltage level during the charge sampling operation, and the reference voltage can have the first voltage level or a second voltage level, different than the first voltage level, during the amplification operation.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   an image sensor pixel;
   a column line configured to receive a signal from the image sensor pixel; and
   a passive amplifier circuit comprising:
      an input port configured to receive the signal from the column line;
      an output port;
      a sampling switch having a first terminal coupled to the input port and having a second terminal coupled to the output port; and
      a metal-oxide-semiconductor capacitor having a gate terminal configured to receive a control signal and having source-drain terminals coupled to the output port.

2. The image sensor of claim 1, wherein the passive amplifier circuit further comprises:
   a capacitor having a first terminal coupled to the output port and having a second terminal configured to receive a reference voltage; and
   an additional metal-oxide semiconductor capacitor having a gate terminal configured to receive an inverted version of the control signal and having source-drain terminals coupled to the output port.

3. The image sensor of claim 2, wherein the metal-oxide-semiconductor capacitor comprises an n-type metal-oxide-semiconductor capacitor and wherein the additional metal-oxide-semiconductor capacitor comprises a p-type metal-oxide-semiconductor capacitor.

4. The image sensor of claim 2, wherein the metal-oxide-semiconductor capacitor and the additional metal-oxide-semiconductor capacitor are activated during a charge sampling phase and are deactivated during an amplification phase.

5. The image sensor of claim 4, wherein the reference voltage has a given voltage level during the charge sampling phase and has the given voltage level during the amplification phase.

6. The image sensor of claim 4, wherein the reference voltage has a first voltage level during the charge sampling phase and has a second voltage level, different than the first voltage level, during the amplification phase.

7. The image sensor of claim 2, wherein the passive amplifier circuit further comprising:
   a comparator having an input coupled to the first terminal of the capacitor and an output on which the control signal is generated.

8. The image sensor of claim 7, wherein the comparator is configured to deassert the control signal when the signal at the input port is within a predetermined voltage range.

9. An amplifier, comprising:
   an input port;
   an output port;
   a sampling switch having a first terminal coupled to the input port and having a second terminal coupled to the output port; and
   a metal-oxide-semiconductor capacitor having source-drain terminals coupled to the output port and having a gate terminal configured to receive a control signal.

10. The amplifier of claim 9, further comprising:
    an additional metal-oxide-semiconductor capacitor having source-drain terminals coupled to the output port and having a gate terminal configured to receive an inverted version of the control signal.

11. The amplifier of claim 10, further comprising:
    a capacitor having a first terminal coupled to the output port and having a second terminal configured to receive a reference voltage.

12. The amplifier of claim 11, wherein:
    the control signal is driven high during a charge sampling operation;
    the control signal is driven low during an amplification operation;

the reference voltage has a first voltage level during the charge sampling operation; and the reference voltage has the first voltage level or a second voltage level, different than the first voltage level, during the amplification operation.

13. The amplifier of claim 11, wherein:

the control signal is driven high during a sampling operation; and the control signal is driven low during an amplification operation.

14. The amplifier of claim 11, wherein:

the reference voltage has a first voltage level during the sampling operation; and the reference voltage has the first voltage level or a second voltage level, different than the first voltage level, during the amplification operation.

15. The amplifier of claim 10, wherein the metal-oxide-semiconductor capacitor comprises an n-type metal-oxide-semiconductor capacitor and wherein the additional metal-oxide-semiconductor capacitor comprises a p-type metal-oxide-semiconductor capacitor.

16. The amplifier of claim 10, wherein the metal-oxide-semiconductor capacitor and the additional metal-oxide-semiconductor capacitor are activated during a first phase and are deactivated during a second phase different than the first phase.

17. The amplifier of claim 16, wherein the first phase comprises a sampling phase and wherein the second phase comprises an amplification phase.

18. The amplifier of claim 9, further comprising:

a comparator having an input coupled to the second terminal of the sampling switch and an output at which the control signal is produced.

19. The amplifier of claim 18, wherein the comparator is configured to deassert the control signal when a signal at the input port is within a predetermined voltage range.

20. The amplifier of claim 18, further comprising:

an inverter having an input coupled to the output of the comparator and to the gate terminal of the metal-oxide-semiconductor capacitor.

* * * * *